United States Patent
Gory et al.

(10) Patent No.: US 7,087,456 B2
(45) Date of Patent: Aug. 8, 2006

(54) STICTION RESISTANT RELEASE PROCESS

(75) Inventors: Igor Gory, Richardson, TX (US);
Bruce Gnade, Lewisville, TX (US);
Fadziso Mantiziba, Denton, TX (US)

(73) Assignee: Zyvex Corporation, Richardson, TX (US)

( * ) Notice: Subject to any disclaimer, the term of this patent is extended or adjusted under 35 U.S.C. 154(b) by 94 days.

(21) Appl. No.: 10/680,021

(22) Filed: Oct. 7, 2003

(65) Prior Publication Data
US 2005/0074913 A1 Apr. 7, 2005

(51) Int. Cl.
*H01L 21/44* (2006.01)
(52) U.S. Cl. .................. 438/106; 438/110; 438/115
(58) Field of Classification Search .............. 438/22, 438/24, 48, 106, 110, 115
See application file for complete search history.

(56) References Cited

U.S. PATENT DOCUMENTS 5,750,420 A * 5/1998 Bono et al. ............... 438/52
6,538,296 B1 * 3/2003 Wan ........................ 257/415

* cited by examiner

*Primary Examiner*—Hsien-Ming Lee
(74) *Attorney, Agent, or Firm*—Haynes and Boone, LLP

(57) ABSTRACT

A method of releasing a micro-electronic device formed over an insulator of a silicon-on-insulator (SOI) substrate. In one embodiment, the release method includes etching at least a portion of the insulator to separate the micro-electronic device from the SOI substrate, rinsing at least the micro-electronic device, exposing at least the micro-electronic device to a micro-sphere solution and removing the micro-electronic device from the SOI substrate. The release method may also include exposing the micro-electronic device to an etching plasma to substantially expunge the micro-sphere solution.

24 Claims, 2 Drawing Sheets

STICTION RESISTANT RELEASE PROCESS

This invention was made with the United States Government support under 70NANB1H3021 awarded by the National Institute of Standards and Technology (NIST). The United States Government has certain rights in the invention.

BACKGROUND

The present invention relates generally to methods for releasing a micro-electronic device from a handle substrate, and more specifically to stiction resistant methods for releasing a micro-electronic device from a handle substrate.

Extraordinary advances are being made in micro-mechanical devices and micro-electronic devices, including micro-electro-mechanical devices (MEMs), which comprise integrated micro-mechanical and micro-electronic devices. The terms "micro-electronic device" and "micro-assembly" are used generically herein to encompass micro-electronic components, micro-mechanical components, MEMs components and assemblies thereof. Generally, micro-electronic device have feature dimensions that are less than about 1000 microns. The present disclosure also relates to nano-electronic devices, including nano-electro-mechanical devices (NEMs), which may have feature dimensions that are less than about 10 microns.

Many micro-electronic devices are initially formed on a silicon-on-insulator (SOI) substrate. An SOI substrate generally comprises an oxide or other insulator layer formed on a handle substrate. The handle substrate is generally employed as a physical interface for wafer transportation, orientation and alignment during and after manufacturing. The insulator layer may have a thickness ranging between about 500 nm and about 5000 nm, and is often (although not necessarily) employed as a sacrificial layer. The SOI substrate also includes a silicon or other semiconductor layer formed on the insulator layer. The micro-electronic devices are generally formed in the silicon layer, such that completed devices can be separated (released) from the SOI substrate by etching the insulator layer underlying the completed devices.

Typically, the insulator layer is removed by a wet etch process, such as one employing an HF etchant chemistry. A rinsing agent, such as de-ionized water (DI water), is then used to flush the entire article, thereby arresting the etching process and at least partially removing residue and contaminants left by the etching process. An active or passive drying process is then performed. However, when the rinsing agent dries between the handle substrate and micro-electronic devices, stiction may occur, causing the micro-electronic devices to adhere to each other and the handle substrate. Such adhesion may be caused by surface tension, van der Waals and/or electrostatic attraction. The adhesive force resulting from stiction between the micro-electronic devices and the handle substrate is often greater than the forces that the micro-electronic devices can structurally withstand. As such, the force required to release the micro-electronic devices from the handle substrate, or the force required to overcome the stiction, is likely to damage the micro-electronic devices. Moreover, proposed solutions to overcome stiction, including the use of a drying gas such as $CO_2$ or a highly evaporative liquid such as glycol or methanol, do not satisfactorily alleviate stiction.

Accordingly, what is needed in the art is a method of releasing a micro-electronic device from a substrate that addresses the above-discussed issues of the prior art.

SUMMARY

To address the above-discussed deficiencies of the prior art, the present disclosure provides a method of releasing a micro-electronic device formed over an insulator of a silicon-on-insulator (SOI) substrate. In one embodiment, the release method includes etching at least a portion of the insulator to separate the micro-electronic device from the SOI substrate, rinsing at least the micro-electronic device, and exposing at least the micro-electronic device to a micro-sphere solution. The release method may also include exposing the micro-electronic device to an etching plasma to substantially expunge residual micro-spheres and/or micro-sphere solution.

The present disclosure also provides a method of manufacturing a micro-electronic device. In one embodiment, the method of manufacturing includes providing a substrate having an insulator layer located over a bulk substrate and a device layer located over the insulator layer. A micro-electronic device is formed in the device layer and the insulator layer is etched to separate the micro-electronic device from the bulk substrate. At least the micro-electronic device is rinsed and then exposed to a micro-sphere solution. The micro-electronic device may then be removed from the substrate. The manufacturing method may also include exposing the micro-electronic device to an etching plasma to substantially expunge residual micro-spheres and/or micro-sphere solution.

A system for releasing a micro-electronic device formed over an SOI substrate insulator is also introduced in the present disclosure. In one embodiment, the system includes means for etching the insulator to separate the micro-electronic device from the SOI substrate. The system also includes means for rinsing at least the micro-electronic device and means for exposing at least the micro-electronic device to a micro-sphere solution. The system may also include means for exposing the micro-electronic device to an etching plasma to substantially expunge residual micro-spheres and/or micro-sphere solution.

The foregoing has outlined preferred and alternative features of several embodiments so that those skilled in the art may better understand the detailed description that follows. Additional features will be described below that further form the subject of the claims herein. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
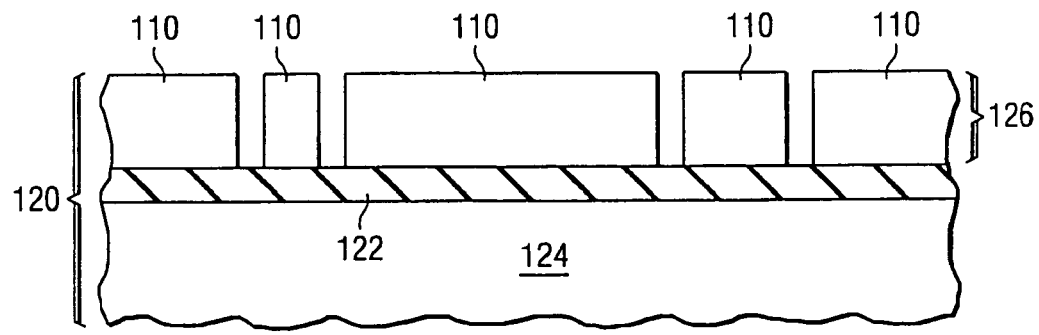
FIG. 1 illustrates an elevation view of one embodiment of a plurality of micro-electronic devices formed on a substrate prior to release according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is an elevation view of one embodiment of a plurality of micro-electronic devices 110 formed in or on a substrate 120 prior to release according to aspects of the present disclosure. The substrate 120 includes an insulating layer 122 located over a bulk substrate or handle portion 124 (hereafter "handle substrate 124"). Moreover, the micro-electronic device 110 may be formed in or on a device layer 126 comprising silicon or another semiconductor material. The device layer 126 may be a discrete layer formed over the insulating layer 122, or may be integral to the substrate 120. Accordingly, those skilled in the art will recognize that the substrate 120 may be a silicon-on-insulator (SOI) substrate.

The micro-electronic devices 110 may be micro-electromechanical devices (MEMs), and may have feature dimensions less than about 1000 microns. The micro-electronic devices 110 may also be nano-electronic devices, including nano-electro-mechanical devices (NEMs), having feature dimensions less than about 10 microns. Of course, the present disclosure is not limited to applications involving devices having any particular feature dimensions.

A process for releasing the micro-electronic devices 110 from the substrate 120 may begin with an etching process to remove at least a portion of the insulating layer 122. In one embodiment, the etching process may be a wet-etching process employing an etching solution comprising hydrofluoric (HF) acid, such as a buffered oxide etch (BOE) chemistry in which hydrofluoric acid is buffered with ammonium fluoride ($NH_4F$). Of course, other etching chemistries may be employed within the scope of the present disclosure. Generally, the etching solution may be selected based on its selectivity to the material of the insulating layer 122. Those skilled in the art will also recognize that the etching process employed to remove at least a portion of the insulating layer 122 may be a plasma process.

In one embodiment, the etching process continues until a rinsing process is initiated. The rinsing process may remove the etching solution, thereby arresting the etching process. The etching process may not be arrested until substantially all of the insulating layer 122 has been removed from between the micro-electronic devices 110 and the substrate 120. In other embodiments, the etching process may be arrested after only a portion of the insulating layer 122 has been removed to the extent that although the micro-electronics devices 110 may be separated from the substrate 120, remnants of the insulating layer 122 may remain on surfaces of the handle substrate 124 and the micro-electronic devices 110.

The rinsing process may also be employed to more thoroughly expunge the etching solution and any contaminants generated during the etching process (e.g., particles dislodged from the insulating layer 122, the handle substrate 124 and/or the micro-electronic devices 110). In one embodiment, multiple rinsing stages may be employed, such as a first rinsing stage employed to arrest the etching process and remove the bulk of the etching solution and a second rinsing stage employed to achieve a desired level of cleanliness. In one embodiment, the rinsing process may include a first rinsing stage spanning a time period of about 2 minutes and a second rinsing stage spanning a time period of about 20 minutes. The rinsing process, or one or more stages thereof, may generally comprise flooding or submersing the substrate 120 and the micro-electronic devices 110 in a rinsing agent, such as de-ionized water or other conventional rinsing agents.

Figure 2:
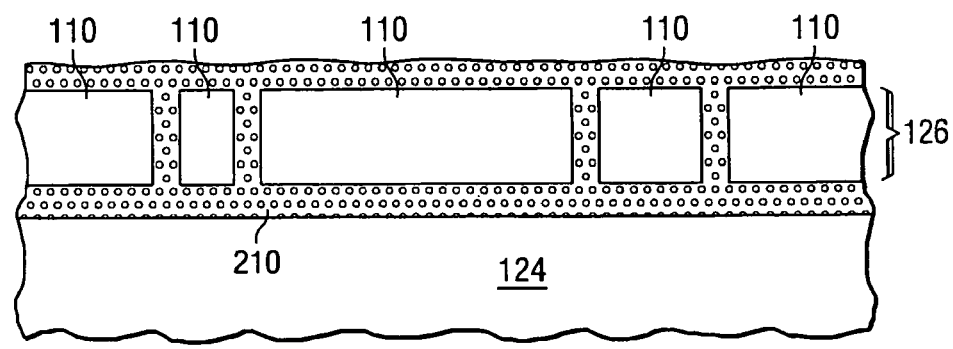
FIG. 2 illustrates an elevation view of the micro-electronic devices shown in FIG. 1 in an intermediate stage of release from the substrate according to aspects of the present disclosure.

Referring to FIG. 2, illustrated is an elevation view of the micro-electronic devices 110 shown in FIG. 1 in an intermediate stage of release from the handle substrate 124 according to aspects of the present disclosure. Once the rinsing process described above is complete, residual rinsing agent remains between the micro-electronic devices 110 and the handle substrate 124. To prevent the residual rinsing agent from causing stiction between the micro-electronic devices 110 and the handle substrate 124, the micro-electronic devices 110 and the handle substrate 124 are submerged in or otherwise exposed to a micro-sphere solution 210, as shown in FIG. 2. Generally, the micro-sphere solution 210 will wick or otherwise flow to locations between the micro-electronic devices 110 and the handle substrate 124.

The micro-sphere solution 210 generally comprises spherically-shaped microscopic particles (micro-spheres) suspended in a transfer medium, possibly at a concentration ranging between about 0.5% and about 5.0%, by volume. The transfer medium may be isopropyl alcohol (IPA) having a purity as high as 99%, although water, methanol and/or other materials may also be employed as the transfer medium. In one embodiment, the micro-spheres may have a diameter ranging between about 0.1 microns and about 5.0 microns. In another embodiment, the micro-spheres may have a diameter ranging between about 0.1 microns and about 1.0 microns. In a more specific embodiment in which the insulating layer 122 has a thickness of about 2.0 microns, the micro-spheres may have a diameter of about 0.5 microns. Generally, it is desirable that the diameter of the micro-spheres be less than the thickness of the insulating layer 122 and the separation between the micro-electronic devices 110. In a preferred embodiment, the micro-spheres comprise polystyrene, although the micro-spheres may also comprise silica or other materials.

After exposing the micro-electronic devices 110 to the micro-sphere solution 210, the micro-sphere solution 210 may be actively or passively dried. The existence of the micro-spheres between the micro-electronic devices 110 and the handle substrate 124 will prevent stiction from occurring when the liquid transfer medium in the micro-sphere solution 210 evaporates. That is, the micro-spheres provide a physical spacer between the micro-electronic devices 110 and the handle substrate 124, thereby allowing ambient air or a process gas to circulate among the micro-electronic devices 110 and between the micro-electronic devices 110 and the handle substrate 124. Consequently, the micro-electronic devices 110 will not adhere to one another or to the handle substrate 124 as the liquid transfer medium in the micro-sphere solution 210 evaporates.

In a preferred embodiment, a plasma or vapor etching process is performed once the micro-sphere solution 210 substantially dries to remove any remaining micro-spheres. The etching process may substantially evaporate or otherwise remove residual amounts of the IPA or other transfer medium in the micro-sphere solution 210 and concurrently etch away the micro-spheres. Such an embodiment may be employed in applications in which it is desirable to have cleaner, smoother surfaces on the released micro-electronic devices 110.

During the evaporating and/or etching processes described above, stiction will be prevented because at least a portion of the micro-spheres will separate the micro-electronic devices 110 from the handle substrate 124 as the liquid transfer medium in the micro-sphere solution 210 evaporates. That is, because the micro-electronic devices 110 will be separated from each other and the handle substrate 124 when interposing liquid is actively or passively dried or evaporated, stiction cannot occur. As noted above, stiction is the result of surface tension, van der walls, electrostatic attraction or other forces that arise when two surfaces are brought together as a liquid between them evaporates. By employing a release method according to aspects of the present disclosure, surfaces of the micro-electronic devices 110 and the handle substrate 124 are prevented from coming into contact when liquid between them evaporates because the microspheres interpose the surfaces. Accordingly, aspects of the present disclosure substantially avoid or eliminate, rather than attempting to overcome, the problem of stiction. Current experimental results indicate that employing a release process according to aspects of the present disclosure may improve product yield values by more than about 500%.

In one embodiment, the etching process comprises an oxygen plasma etch. The power of the signal employed to strike the etching plasma may range between about 400 W and about 600 W, the etching time may range between about 5 minutes and about 90 minutes, and the oxygen gas flow to the process chamber may range between about 10 sccm and about 100 sccm. In a more specific embodiment, the plasma etch employs an oxygen constituent and a forming gas constituent, wherein the plasma is generated by an RF signal power of about 500 W, the etching time is about 45 minutes, the oxygen gas flow is about 50 sccm and the forming gas flow is about 10 sccm. The forming gas may comprise $N_2$—$H_2$, although other chemistries may be employed. The etching process may also or alternatively include an oxygen vapor etch, possibly according to etching parameters known in the art. Of course, the process parameters described above for the etching process are exemplary, and other plasma and/or vapor etch processes and parameters may be employed within the scope of the present disclosure to remove the residual micro-sphere solution 210 and/or micro-spheres.

After the micro-spheres are substantially removed from the micro-electronic devices 110 and the handle substrate 124 by the etching process described above, the micro-electronic devices 110 may be removed from the handle substrate 124 without having to overcome stiction. As such, only minimal force may be required to lift the released micro-electronic devices 110 away from the handle substrate 124. In one embodiment, one or more contact probes 310 may be employed to lift the released micro-electronic devices 110 from the handle substrate 124. The micro-electronic devices 110 may adhere to the contact probe by surface adhesion or other molecular level forces, by vacuum and/or by an adhesive. However, the adhesion of the micro-electronic devices 110 to the contact probe 310 or other tool employed to lift the micro-electronic devices 110 from the handle substrate 124 may be very small because the force required to lift the micro-electronic devices 110 does not need to overcome stiction. As such, the micro-electronic devices 110 may be released from the handle substrate 124 with much lower forces than in conventional release processes, such that the handling forces applied to the micro-electronic devices 110 may be well within the range of forces the micro-electronic devices 110 were designed to withstand.

Figure 3:
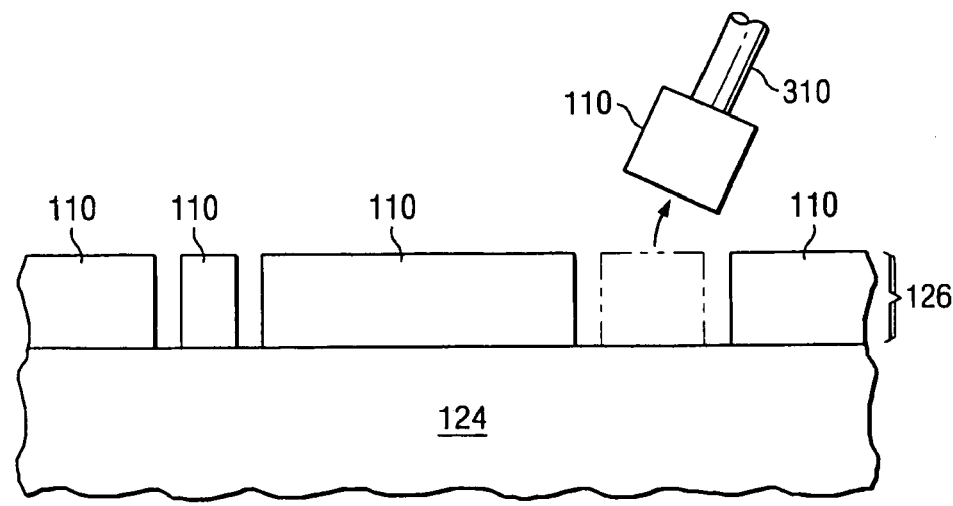
FIG. 3 illustrates an elevation view of the micro-electronic devices shown in FIG. 2 in a subsequent stage of release from the substrate according to aspects of the present disclosure.
Figure 4:
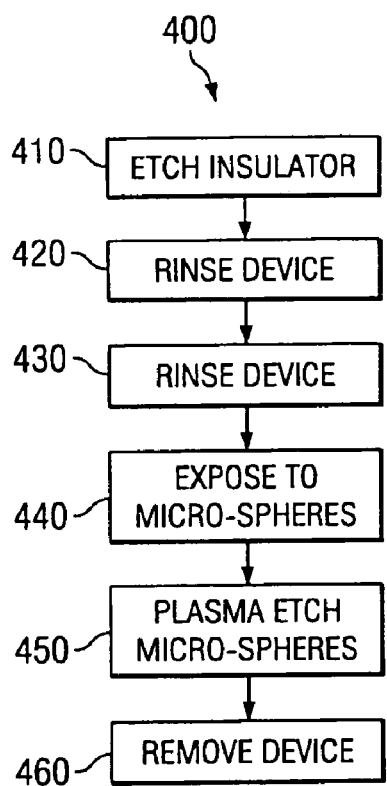
FIG. 4 illustrates a flow-chart diagram of one embodiment of a micro-electronic device release process according to aspects of the present disclosure.

Thus, the present disclosure introduces the concept of the employing micro-spheres as part of a release process in order to prevent stiction. As shown in FIG. 4, which is a flow-chart diagram summarizing one embodiment of a release process according to aspects of the present disclosure, a method 400 of releasing a micro-electronic device formed over an insulator of an SOI or other substrate may include etching the insulator in a first step 410, rinsing at least the device in a second step 420 to arrest the etch process of the first step 410, and rinsing at least the device in a third step 430 to expunge the residual etching solution and insulator particulate. In a subsequent step 440, at least the device is exposed to a micro-sphere solution, as described above with reference to FIGS. 1–3. The micro-sphere solution is then evaporated or otherwise removed, possibly by a plasma etching process in a next step 450. These steps release the device from the substrate, such that the device may be removed in a step 460 without using excessive force to overcome stiction. Of course, in some embodiments it may be preferred that the step 460 be omitted, such that the device is released according to the method 400 but not necessarily removed from the substrate. Those skilled in the art will recognize that the particular number and order of steps described above may be altered as necessary for a specific application, and that such modifications are within the scope of the present disclosure.

Figure 5:
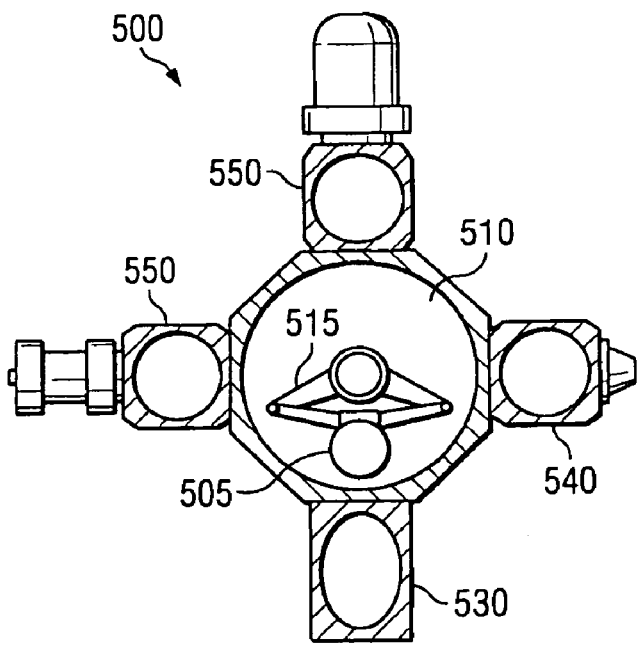
FIG. 5 illustrates a plan view of one embodiment of a system for releasing a micro-electronic device formed over an SOI substrate insulator according to aspects of the present disclosure.

Referring to FIG. 5, illustrated is a plan view of one embodiment of a system 500 for releasing a micro-electronic device formed over an SOI substrate insulator according to aspects of the present disclosure. In one embodiment, the system 500 is one environment in which the device release processes represented in FIGS. 1–4 may be performed. The system 500 may be at least similar to a deposition cluster system, such as an AME5000 distributed by Applied Materials of Austin, Tex.

The system 500 may include one or more carrier chambers 510 wherein substrates 505 undergoing processing may be transported by mechanical or robotic arms 515. The system 500 may include one or more load lock chambers 530 for loading substrates 505 into the system 500. The load lock chambers 530 may also serve as holding chambers between processes performed in other chambers, such as when a processing chamber is undergoing purging, preheating or other similar processes well known to those of ordinary skill in the art.

The system 500 may also include one or more preparation chambers 540. The preparation chambers 540 may be employed to orient substrates 505, such as for positioning a surface to be processed, or for precisely positioning alignment notches on the substrates 505. The preparation chambers 540 may also be employed as plasma cleaning reactors, wherein substrates 505 may be processed prior to or after a film deposition or etching process.

The remaining chambers 550 shown in FIG. 5 may be conventional processing chambers, including those typically employed to form various insulating and metallization layers conventionally found in MEMs and semiconductor devices. For example, one or more of the chambers 550 may be employed to form the micro-electronic devices 110 over or in the substrate 120 shown in FIG. 1. One or more of the chambers 550 may also be employed to form wet-etching processes, plasma-etching processes and/or submersion processes. For example, one of the chambers 550 may be employed to submerse an in-process wafer into a chemical-etch solution such as one comprising HF, a rinsing solution such as one comprising DI water, and/or a micro-sphere solution such as one comprising polystyrene micro-spheres suspended in isopropyl alcohol. Another one or more of the chambers 550 may be employed to perform a plasma etching process, such as those described above with reference to FIGS. 1–4 and employed to etch or otherwise remove a micro-sphere solution from between micro-electronic devices and the substrate on which the devices are formed.

The present invention has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

The invention claimed is:

1. A method of releasing a micro-electronic device formed over an insulator of a silicon-on-insulator (SOI) substrate, comprising:
   etching at least a portion of the insulator to separate the micro-electronic device from the SOI substrate;
   rinsing at least the micro-electronic device; and
   exposing at least the micro-electronic device to a micro-sphere solution comprising a plurality of micro-spheres each having a diameter no less than about 0.1 µm.

2. The method of claim 1 further comprising removing the micro-electronic device from the SOI substrate after exposing the micro-electronic device to the micro-sphere solution.

3. The method of claim 1 wherein the insulator is etched by an etching solution comprising HF.

4. The method of claim 1 wherein the rinsing includes rinsing in de-ionized water.

5. The method of claim 1 wherein the rinsing includes a first rinse to arrest the etching and a second rinse to substantially expunge an etching solution.

6. The method of claim 1 wherein the micro-sphere solution comprises micro-spheres having a diameter ranging between about 0.1 µm and about 2.0 µm.

7. The method of claim 1 wherein the micro-sphere solution comprises polystyrene micro-spheres.

8. The method of claim 1 wherein the micro-sphere solution comprises silica micro-spheres.

9. The method of claim 1 wherein the micro-sphere solution comprises polystyrene micro-spheres suspended in an isopropyl alcohol solution at a concentration ranging between about 0.5% and about 5.0%, by volume.

10. The method of claim 1 wherein the micro-electronic device is exposed to the micro-sphere solution for at least 20 minutes.

11. The method of claim 1 further comprising exposing the micro-electronic device to an etching plasma to substantially expunge the micro-sphere solution.

12. The method of claim 11 wherein the etching plasma comprises an oxygen constituent and a forming gas constituent.

13. The method of claim 12 wherein the forming gas constituent comprises $N_2$—$H_2$ and the micro-electronic device is exposed to the oxygen constituent at an oxygen flow rate ranging between about 25 sccm and about 75 sccm and concurrently exposed to the forming gas constituent at a forming gas flow rate ranging between about 5 sccm and about 15 sccm.

14. The method of claim 11 wherein the etching plasma is generated by an RF signal power ranging between about 400 watts and about 600 watts.

15. The method of claim 1 further comprising exposing the micro-electronic device to an etching gas to substantially expunge the micro-sphere solution.

16. The method of claim 1 wherein the micro-electronic device is a micro-electromechanical device having feature dimensions less than about 1000 microns.

17. The method of claim 1 wherein the micro-electronic device is a nano-electromechanical device having feature dimensions less than about 10 microns.

18. A method of manufacturing a micro-electronic device, comprising:
   providing a substrate having an insulator layer located over a bulk substrate and a device layer located over the insulator layer;
   forming a micro-electronic device in the device layer;
   etching the insulator layer to separate the micro-electronic device from the bulk substrate;
   rinsing at least the micro-electronic device; and
   exposing at least the micro-electronic device to a micro-sphere solution comprising a plurality of micro-spheres each having a diameter no less than about 0.1 µm.

19. The method of claim 18 further comprising removing the micro-electronic device from the substrate.

20. The method of claim 18 wherein the bulk substrate, insulator layer and device layer are collectively a silicon-on-insulator substrate.

21. The method of claim 18 wherein the micro-electronic device is a nano-electronic device having feature dimensions less than about 10 microns.

22. The method of claim 18 further comprising exposing the micro-electronic device to an etching plasma to substantially expunge the micro-sphere solution.

23. The method of claim 22 wherein the etching plasma comprises an oxygen constituent and an $N_2$—$H_2$ constituent.

24. The method of claim 18 further comprising exposing the micro-electronic device to an etching gas to substantially expunge the micro-sphere solution.

* * * * *